United States Patent
Person et al.

(10) Patent No.: US 6,366,192 B2
(45) Date of Patent: Apr. 2, 2002

(54) STRUCTURE OF MAKING A THICK FILM LOW VALUE HIGH FREQUENCY INDUCTOR

(75) Inventors: Herman R. Person; Thomas L. Veik; Jeffrey T. Adelman, all of Columbus, NE (US)

(73) Assignee: Vishay Dale Electronics, Inc., Columbus, NE (US)

( * ) Notice: Subject to any disclaimer, the term of this patent is extended or adjusted under 35 U.S.C. 154(b) by 0 days.

(21) Appl. No.: 09/834,123

(22) Filed: Apr. 12, 2001

Related U.S. Application Data

(60) Continuation of application No. 09/370,442, filed on Aug. 9, 1999, now abandoned, which is a continuation of application No. 09/079,808, filed on May 15, 1998, now abandoned, which is a division of application No. 08/936,193, filed on Sep. 17, 1997, now Pat. No. 5,922,514.

(30) Foreign Application Priority Data

| Sep. 11, 1998 | (EP) | ............................................. 98307376 |
| Sep. 17, 1998 | (JP) | ........................................... 10-263038 |

(51) Int. Cl.$^7$ ............................................................. H01F 5/00
(52) U.S. Cl. ......................... 336/200; 336/223; 336/232
(58) Field of Search ................................. 336/200, 223, 336/232

(56) References Cited

U.S. PATENT DOCUMENTS

| 3,726,004 A | * | 4/1973 | Holland et al. ............ 29/602.1 |
| 3,765,082 A | | 10/1973 | Zyetz |
| 3,874,075 A | | 4/1975 | Lohse |
| 4,016,519 A | * | 4/1977 | Haas .......................... 336/200 |
| 4,342,143 A | | 8/1982 | Jennings |
| 4,626,816 A | | 12/1986 | Blumkin et al. |
| 4,670,734 A | | 6/1987 | Caddock |
| 4,730,095 A | | 3/1988 | Richter-Jorgensen |
| 4,905,358 A | | 3/1990 | Einbinder |
| 4,970,780 A | | 11/1990 | Suda et al. |
| 5,071,509 A | | 12/1991 | Kano et al. |
| 5,091,286 A | | 2/1992 | Person |
| 5,307,045 A | | 4/1994 | Senda et al. |
| 5,373,112 A | | 12/1994 | Kamimura |
| 5,504,986 A | | 4/1996 | Casey et al. |
| 5,524,490 A | * | 6/1996 | Lautzenhiser et al. ... 73/514.16 |
| 5,598,136 A | | 1/1997 | Kano et al. |
| 5,639,391 A | | 6/1997 | Person |
| 5,802,702 A | * | 9/1998 | Fleming et al. ................ 29/608 |
| 5,809,634 A | | 9/1998 | Inaba |
| 5,922,514 A | * | 7/1999 | Person et al. ................ 430/311 |
| 6,038,133 A | * | 3/2000 | Nakatani et al. ............. 361/760 |

FOREIGN PATENT DOCUMENTS

| GB | 2 263 582 A | | 7/1993 |
| JP | 407297033 A | | 11/1955 |
| JP | 359208707 A | | 11/1984 |
| JP | 363073606 A | | 4/1988 |
| JP | 401021993 A | | 1/1989 |
| JP | 40833993 A | * | 12/1996 |

* cited by examiner

*Primary Examiner*—Anh Mai
(74) *Attorney, Agent, or Firm*—Zarley, McKee, Thomte, Voorhees & Sease, P.L.C.

(57) ABSTRACT

A thick film low value high frequency inductor made by the process of subjecting a conductor layer to a plurality of linear cuts by a pulsing laser cutter imposed simultaneously on the entire length of the linear cut being made to create a cross sectional cut of substantial rectangular configuration. The conductor body is a layer of dried silver thick film ink. The method of making a thick film low value high frequency inductor involves the steps of taking a conductor layer comprised of a dried layer of photo sensitive silver ink, masking the ink with the negative of the desired configuration of the ink, exposing the ink to UV radiation, developing the ink, and firing the layer to adhere the silver to the layer.

1 Claim, 2 Drawing Sheets

STRUCTURE OF MAKING A THICK FILM LOW VALUE HIGH FREQUENCY INDUCTOR

This application is a continuation of application Ser. No. 09/370,442 filed Aug. 9, 1999, now abandoned which is a continuation of Ser. No. 09/079,808 filed May 15, 1998, (now abandoned), which is a division of Ser. No. 08/936,193 filed Sep. 17, 1997, now U.S. Pat. No. 5,922,514 issued Jul. 13, 1999.

FIELD OF THE INVENTION

This invention relates to the design and construction of low value, high frequency inductors. These parts are particularly suited for the communications industry. The current trend is toward continued miniaturization and increased frequency.

BACKGROUND OF THE INVENTION

Typical prior art inductors use one of two manufacturing processes. 1) Thin Film or 2) Individually spiraled copper plated ceramic cores.

The Thin Film process requires large capital expenditures. Additionally, the time to build up conductor thicknesses sufficient to meet Q requirements is long, keeping manufacturing costs high.

The second process, spiraled parts, has very high manufacturing costs due mainly to the necessity to handle parts individually. Individual part handling increases manufacturing time and costs dramatically.

Q is a measure of quality in inductors. It is the ratio of inductive reactance, to the sum of all resistive losses. Inductive reactance is desirable. Resistive losses, one of which is skin effect, are undesirable.

Skin effect is the tendency for alternating current to flow near the surface of conductors in lieu of flowing in a manner as to utilize the entire cross sectional area of conductors. This phenomenon causes the resistance of the conductor to increase, thus reducing Q. When the conductor cross section includes sharpened areas at each side, skin effect is even worse. Existing equipment and methods diminish the Q value because the cross sectional cut of conductor layers in fabrication create cross sectional cuts of non-rectangular configuration.

A high frequency chip inductor on ceramic is currently made by screenprinting thickfilm conductor ink forming fine lines on a ceramic substrate. An alternative method is to expose photoimageable conductor ink to UV radiation through a mask, and then develop the pattern via wet chemistry processing. However, these two technologies limit the number of turns in the spiral because they are limited to making line widths no finer than about 4 mils.

It is therefore a principal object of this invention to provide a thick film low value high frequency inductor which is low in resistive losses including skin effect.

A further object of this invention is to provide a thick film low value high frequency inductor, and a method of manufacturing the same which does not have sharpened areas at its side edges whereupon skin effect is reduced.

A still further object of the invention is to use a pulsing laser cutting technique wherein the entire cut is performed simultaneously which shortens the cutting time.

A still further alternative object of this invention is to provide a method of making an inductor using a photosensitive silver ladened printing ink exposed to ultra violet light in combination with a suitable negative image mask to create the desired image.

A still further object of this invention is to provide a chip inductor comprised of a multi-turn spiral coil on the upper surface of a nonmagnetic dielectric substrate.

A still further object of this invention is a chip inductor comprised of a spiral coil which is formed by ablating a spiral coil pattern into a conductive layer on a substrate by the use of a laser beam.

A still further object of this invention is a chip inductor coil formed by ablating a spiral coil pattern into a conductive layer on a substrate by the use of an excimer laser operating in the ultraviolet region of the electromagnetic spectrum.

A still further object of this invention is to provide for a substrate base layer that has a low dielectric constant of around 4, which is considerably lower than alumina, which is around 9.

A still further object of this invention provides for a substrate made of alumina and has a layer of a low dielectric constant dielectric covering the upper surface of said alumina substrate and underlays said conductive layer.

A still further object of this invention provides for an excimer laser that can ablate the conductive layer to provide the shape of a spiral conductive coil without cutting into the low dielectric constant dielectric layer on the upper side of the alumina substrate or into the alumina substrate itself.

A still further object of this invention provides for a second spiral coil to be positioned above the first spiral coil on the substrate with a layer of low K dielectric between the two coils to keep said coils spaced apart but with a via hole positioned to connect one end of each coil to provide for two coils in series.

These and other objectives will be apparent to those skilled in the art.

SUMMARY OF THE INVENTION

A laser pulsing technique of the type disclosed in U.S. Pat. No. 5,091,286 is used to laser cut the coil image in a conductive coil. The low pulsing technique of the '286 patent is incorporated herein by reference. This process yields conductor cross sections that are more rectangular than in conventional thick film screen printing.

This invention involves a new and improved method for manufacturing a high frequency chip inductor on ceramic. This new method allows achieving higher inductance values by making line widths much finer than the 2 mils allowed by the prior art. Finer lines permitting more loops than allowed by the prior art.

This new method consists of using the ultraviolet output of an excimer laser to cut a planar spiral coil pattern in conductor material that is in the form of a flat layer on a substrate. However, rather than making linear cuts with a fine focused, scanned beam (as would be done in a typical industrial metal cutting operation), a beam with a large cross section, approximately 4 cm by 3 cm, is projected through a metal "stencil" mask that contains the coil pattern. This transforms the beam's uniformly intense cross section into a cross section containing the coil pattern. The transformed beam is then optically focused onto a blank metal target into which the coil pattern is burned or permanently transfixed by the process of ablation. The UV excimer laser has a pulsed output so that one or more pulses will be required to produce a clean and clear coil pattern in the conductor material. The number of pulses required will increase with the thickness of the conductor. Suitable conductor targets on ceramic can be made by thickfilm printing, thinfilm deposition, or by bonding metal foil to the ceramic surface.

An alternate form of the invention creates the rectangular cross sectional cuts of conductor layers by a special film screening process which involves the steps of taking a ceramic sheet of high (very hard) alumina which is prescribed so that it can be broken into small inductors. An organic layer of silver ladened ink is printed thereon, and then dried. A photo mask that is a negative of the desired image is placed over, and in contact with, the dried photo-imagable ink. This configuration is next exposed to UV radiation, polymerizing the ink not masked by the photo mask. Next the photo mask is removed and the "ink" is then chemically developed, the nonpolymerized material is washed away and the desired silver image remains. The device is then fired, the non-developed material is washed away and the silver image remains. Appropriate crossovers between images can thereafter be printed. This process produces a conductor layer with rectangular cross sections and which provides conductors with line, widths and spacings smaller than can be made with conventional thick film screen printing.

DESCRIPTION OF THE PREFERRED EMBODIMENT

Before describing the process of manufacturing the inductors, it should be understood that hundreds of even thousands of individual parts are formed on each substrate. Each substrate will hold a rectangular array of chip inductors. The substrate material is alumina, and has been scored on its top surface by its manufacturer at the boundaries of the individual inductors that will be printed thereon. The scoring is an aid in breaking the substrate into individual inductors when all screen printing steps have been completed. Scoring of the bottom side of the substrate is optional.

Each pattern is thick film screen printed with the appropriate inks. Each individual print includes the required alignment marks for proper print to substrate, and print to print alignment.

Figure 2A:
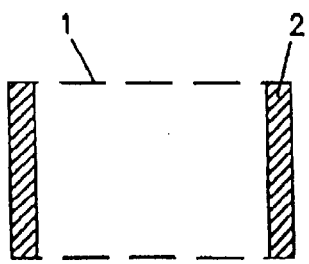
FIG. 2A is an end termination print on back side of substrate.

The first print, shown in FIG. 2A, is the silver bottom side termination. It is printed on the bottom, non-scored side of the substrate. Bottom side scoring is optional.

Figure 2B:
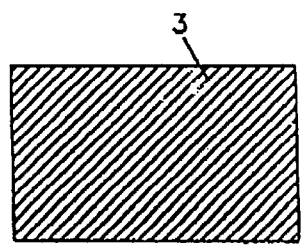
FIG. 2B is a dielectric base coat on top side of substrate.

The second print, shown in FIG. 2B, is a dielectric base having a low dielectric constant. One very important quality of low value, high frequency inductors is high Self Resonant Frequency (SRF). To achieve this, the inductor must be manufactured using materials with the lowest dielectric constant possible. The dielectric constant of the alumina substrate is excessively high, around 9. Covering the alumina substrate with a dielectric base coat with a lower dielectric constant, around 4, helps to keep the Self Resonant Frequency of the inductor as high as possible.

Figure 2C:
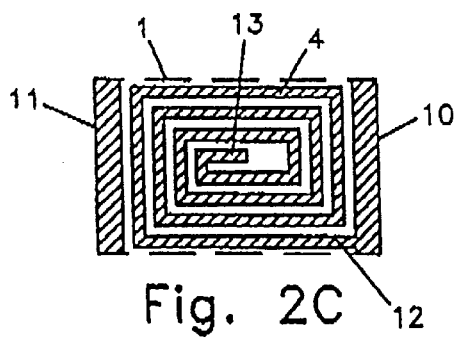
FIG. 2C is a coil print.

FIG. 2C is the silver inductor coil resulting from the process of this invention. After the completion of the coil in FIG. 2C, a dielectric material is screen printed over the coil to provide for a crossover dielectric layer shown-in FIG. 2D. Its function is to prevent electrical shorting between the inductor coil and the silver crossover printed thereon.

Figure 2D:
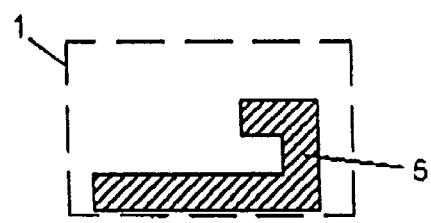
FIG. 2D is a crossover dielectric.
Figure 2E:
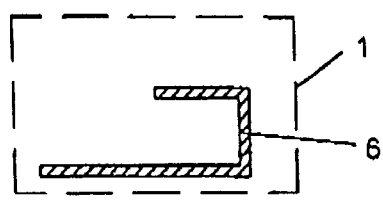
FIG. 2E is a crossover conductor.

FIG. 2E illustrates the silver crossover print. The silver coil of FIG. 2C has a first end 12 connected to a first termination 10. It is the function of the silver crossover to electrically connect the second end of the silver coil 13 to the second termination 11.

Figure 2F:
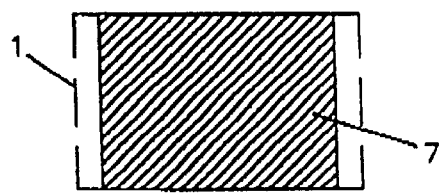
FIG. 2F is a dielectric overcoat.

The next print, FIG. 2F, is the dielectric overcoat. This material, like all the other dielectric materials, must have a dielectric constant as low as possible, preferably less than 4–5. The dielectric overcoat protects the inductor from environmental factors.

At this point, all the physical features for a single spiral coil chip inductor have been described. There are two different technologies (to be described later in this application) that can be used to fabricate the single spiral inductor. One technology uses a photoimageable thickfilm conductor composition, such as a modification of DuPont's FODEL® system. The FODEL® ink utilizing silver and palladium has been modified herein to use only silver. The other, alternate technology requires the use of an excimer laser, which operates in the near ultraviolet, to ablate layers of conventional thickfilm conductor materials. Such conventional conductor materials are available from vendors such as Heraeus-Cermalloy, DuPont, Electroscience Labs, Thick Film Systems, Inc., and so forth.

A second viable form of this invention consists of having two spiral coils, one on top of the other, rather than just a single spiral coil. Having two spiral coils instead of one provides a significant increase in the inductance. This alternate design with two coils necessitates some minor changes in the patterns of FIG. 2. Such alternate patterns are now herein described.

Figure 5A:
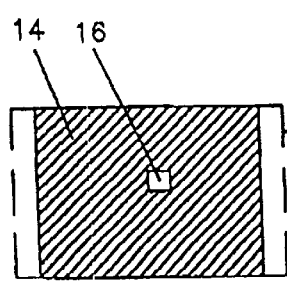
FIG. 5A is an alternate crossover dielectric with via hole.
Figure 5B:
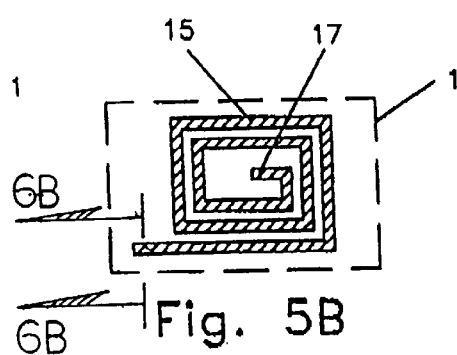
FIG. 5B is an alternate crossover conductor.

FIG. 5A shows a crossover dielectric 14, providing more area coverage, that would be used instead of the crossover dielectric 5 of FIG. 2D. FIG. 5B illustrates the second coil 15, that would be used instead of the crossover conductor 6 of FIG. 2E. The electrical connection between end 13 of coil 4 (FIG. 2C) and end 17 of coil 15 (FIG. 5B) is accomplished through via hole 16 (FIG. 5A).

Figure 1:
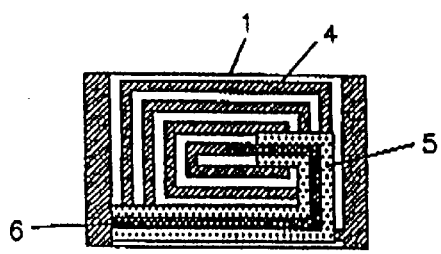
FIG. 1 is a plan view of chip inductor excluding dielectric overcoat.
Figure 5C:
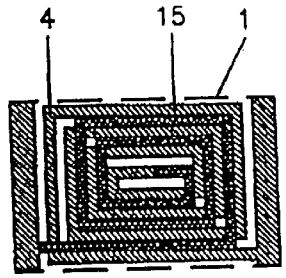
FIG. 5C is a coil and alternate crossover conductor showing relative positions.

FIG. 5C shows the second spiral coil 15 over coil 4. Note that the alternate crossover dielectric 14 is not shown because it would hide coil 4. Note in FIG. 5C as well as FIG. 1, the conductor overlap is kept to a minimum, in order to minimize the conductor to conductor capacitance and, hence, maximize the self resonant frequency. After this second coil is formed, then a top dielectric coating is applied in the same way as would be done for the single spiral coil inductor.

Figure 3A:
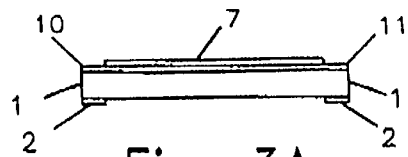
FIG. 3A is an end view of strips of chip inductors (edge view of individual component) immediately after breaking into strips.
Figure 3B:
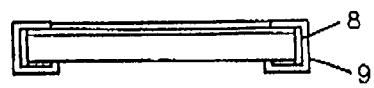
FIG. 3B is an end view of strips of chip inductors after applying edge termination.
Figure 4:
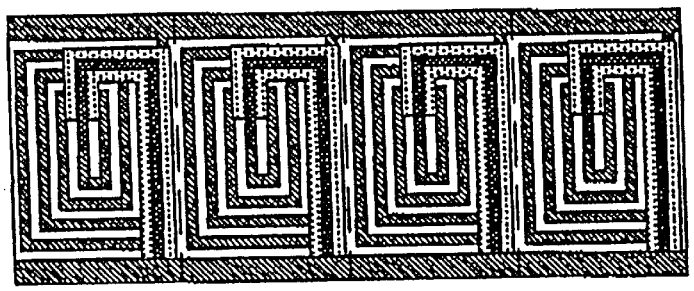
FIG. 4 is a plan view of a strip of chip inductors ready for edge termination.

After all the desired patterns are formed and the top coatings applied, then the next step is to break the substrates into strips as shown in FIG. 4. This prepares the chip inductors for edge termination. FIG. 3A is an end view of a strip of chip inductors. Note that the alumina substrate 1 is exposed between bottom terminations 2 and end terminations 10, 11, at the edge of the strips. Next, a very thin layer of metal 8 is sputtered onto the strip edges as shown in FIG. 3B to prepare the edge for plating. Following this, a solderable termination 9 is plated on the edges of the strips. The next step is to break the strips into individual chip inductors. The breaks will of course occur along the scribes in the alumina substrate.

Prior Art

Figure 6A:
FIG. 6A is a cross section of a conventional prior art screen printed conductor.
Figure 6B:
FIG. 6B is a cross section of silver conductor made according to this invention as taken on line 6B—6B of FIG. 5B.

The prior art simply uses standard and, commonly known, thickfilm screen printing techniques to print spiral coils, crossover dielectrics, crossover conductors, and top or overcoat dielectric materials. There are several major disadvantages to the prior art in that: 1) conductor line widths and spaces between said lines cannot be printed reliably and repeatedly small than about 0.006". Also, the conductor profile or cross-section do not have sharp, square edges at the substrate interface, but will show a feathering or a sloping of the edge, as shown in FIG. 6A. This deviation from a vertical edge surface is believed to contribute substantially to the AC or high frequency resistance that will adversely affect the quality, or Q, of the chip inductor, as shown in FIG. 6B. With a more vertical edge and square sides, the electrical properties of the chip inductor are greatly improved and enhanced. The two, alternate methods to be described herein provide the capability to produce spiral coils whose edges are sharp and square, and sides which are vertical that minimize undesirable AC effects.

Photoimagable Process

The first process uses a photoimagable, photosensitive conductive thick film composition. Ink material for the process is a modification, as explained above, of the DuPont Company FODEL® ink, and hereafter will be referred to as the photoimagable process. The photoimagable process generally consists of printing a blank or uniform layer of the photoimagable silver ladened conductive ink onto the substrate while under a safe light. After drying, a photonegative, usually made of mylar and with the coil pattern, is positioned in intimate contact onto the conductor layer and carefully aligned with the aid of fudicials or alignment marks by a mask aligner. The alignment is very important because each coil must be precisely located. The photoimagable conductor material is then exposed to an intense flux of ultraviolet radiation in the mask aligner machinery. Where the UV radiation is able to pass through the negative unobstructed, the photoimagable material is polymerized and therefore will stay fixed. The areas which are protected from the UV radiation will wash away in the subsequent developing steps. Because of the short wavelength of the UV radiation, it is possible to obtain conductor lines and spaces of about 0.002" each. The edges are sharp and square, the sides are vertical and smooth. The photoimagable process is clearly a significant improvement over the conventional prior art.

Laser Cutting Process

The second method of manufacturing this type of chip inductor uses a laser beam, particularly an excimer laser beam that has an ultraviolet output at 248 nanometers wavelength.

This alternate method for manufacturing the high frequency chip inductor on ceramic allows higher inductance values by making line widths and spaces approximately 0.001". Such fine lines permit more loops and, thus, higher inductances. This method consists of using the ultraviolet output of an excimer laser to cut a planar spiral coil pattern in conductor material that is in the form of a flat layer on a substrate. However, rather than making linear cuts with a fine focused, scanned beam (as would be done in a typical industrial metal cutting operation), a beam is projected with a large cross section, approximately 4 cm by 3 cm, through a metal "stencil" mask that contains the coil pattern. This transforms the beam's uniformly intense cross section into a cross section containing the coil pattern. The transformed beam is then optically focused onto a blank metal target into which the coil pattern is burned or permanently transfixed by the process of ablation. The UV excimer laser has a pulsed output so that single or multiple pulses will be required to produce a clean and clear coil pattern in the conductor material. The number of pulses required will increase with the thickness of the conductor. Suitable conductor targets on ceramic can be made by thickfilm printing, thinfilm deposition, or by bonding metal foil to the ceramic surface.

Both the photoimagable process and the laser process yield conductor cross sections that are more rectangular than conventional thick film screen printing. FIG. 6A shows the typical cross section of a conductor that is thick film screen printed. FIG. 6B shows the improved cross section of conductors formed by laser cutting or by the photoimagable process. The more rectangular cross section of FIG. 6B gives a desirable reduction of the skin effect in the conductor, resulting in improved Q. The cost of the photoimagable process is comparable economically to the conventional thick film process, thus it is possible to meet the cost reduction goal of this invention.

As indicated heretofore, Q is a measure of quality in inductors. It is the ratio of inductive reactance to the sum of all resistive losses. Inductive reactance is desirable. Resistive losses, one of which is the skin effect, are undesirable.

As previously discussed, the skin effect is the tendency for alternating current to flow near the surface of conductors in lieu of flowing in a manner as to utilize the entire cross sectional area of conductors. This phenomenon causes the resistance of the conductor to increase, thus reducing Q. When the conductor cross section includes sharpened areas at each side, the skin effect is increased. The important difference between the two cross sections is that the cross section of FIG. 6B does not include the sharpened areas at its sides which appear in the cross section of FIG. 6A.

As indicated before, the laser system disclosed in U.S. Pat. No. 5,091,286 is of the type which can be used in this invention. Such an excimer system is available from Lambda Physick, Inc., 289 Great Road, Acton, Mass. 01720, or the Lumonics Corp., Kanata, Ontario, Canada.

In summary, the thick film conductor material is screen printed onto a ceramic substrate to a thickness of 15 to 25 microns and is then dried. At this point, there are two options: to either laser cut the conductor material in its green (or unfired) state or to sinter (fire) it first and then laser cut the coil. It turns out that UV laser radiation can cut into the conductor material regardless of the state it is in.

The advantage of cutting the conductor in the green state is that less laser energy is reflected by the surface so that more energy is incorporated into the cutting action. The net result is fewer laser pulses would be needed to completely cut a coil. However, a disadvantage to the green state is that the coils are very fragile and will rub off easily. Cutting the fired state, on the other hand, where the conductor is much more durable, will require more pulses because the conductor material is more reflective and allows less of the incident UV energy to interact with the metal.

The conductor material can be any of a variety of commercially available thick film inks, but the preferred material is silver because of its high conductivity and availability. Other conductor materials except gold or copper will have conductivities that are too low and will generally make chip inductors with inferior quality (Q). The addition of silver to the conventional FODEL® process and the elimination of palladium therefrom mentioned heretofore is a part of this invention.

After the conductive blank has been applied to the substrate, it is ready to have the coil pattern cut in it. This is accomplished by the use of a metal stencil mask that is positioned in the path of the beam. The mask consists of a 2.25 inches square, 0.003–0.010 inch thick sheet of metal, usually stainless steel or beryllium copper, that contains a cutout of the desired coil pattern. The cutout can be made by either a laser cutting process or by a wet etching process. The laser beam has a uniform cross section prior to incidence on the mask, but upon emerging through the mask it has a spiral coil cross section because of the optical shadowing by the mask. The mask is a positive relative to the final product; that is, the cutout in the mask is also cutout in the silver. The optical system consists of a set of lenses and mirrors that direct and focus the laser beam so as to images the coil pattern onto the metal target blank. Focusing the laser beam results in an increase in the laser power density to levels that can easily ablate the metallization of the target. Usually the focused image is about a factor of 8× smaller than the mask pattern.

If the mask is thin (i.e., approximately 0.003 inches thick) and if there are more than just a few of loops in the mask, the mask may become rather flimsy. In this case the loops may deviate from the plane of the mask and will most likely result in portions of the image being out of focus. The cut coils will then tend to have less sharpness and lower line definition. The net result will more than likely be inductors of lower Q. Loop supports or hangers will keep the loops planar, but they will show up in the cut coil because the UV wavelengths do an excellent job of reproducing all the details found in the mask. One way around this potential problem is to use a mask whose thickness is sufficient to keep the coil pattern rigid. This can be accomplished by a 0.010 inch thick stainless steel. Such a mask can be chemically etched.

Generally, any rare gas-halide excimer laser with emission in the ultraviolet range is suitable for cutting the coil pattern; however, the krypton fluoride (KrF) excimer laser, with it's output at 248 nanometers, appears to make cuts of the best quality. The ultraviolet radiation removes material through the process of ablation, in which thin layers (one to several microns) of the metal thickness are removed with each laser pulse. Multiple pulses are usually required to cut completely through 1 or 2 mil thick metal film.

From the foregoing it is seen that a thick film low value high frequency inductor having high quality (Q) is made possible with resistive losses and skin effects substantially reduced by creating a rectangular cross section in the conductor trade of the coil.

What is claimed is:

1. A thick film low value high frequency inductor, comprising, a substrate layer having a dielectric base coat thereon, a conductor layer on the substrate layer comprised of dry photo-sensitive photographically developed silver ink, the ink having a configuration comprised of conductor lines which are spaced and are less than 4 mils apart, the silver in the lines being laser heat fused to the dielectric base coat.

* * * * *